(12) United States Patent
Lin

(10) Patent No.: US 9,295,158 B2
(45) Date of Patent: Mar. 22, 2016

(54) METHOD OF MANUFACTURING PRINTED CIRCUIT BOARD HAVING ELECTRONIC COMPONENT EMBEDDED

(71) Applicant: SunASIC Technologies, Inc., New Taipei (TW)

(72) Inventor: Chi-Chou Lin, New Taipei (TW)

(73) Assignee: Sunasic Technologies, Inc., New Taipei (TW)

( * ) Notice: Subject to any disclaimer, the term of this patent is extended or adjusted under 35 U.S.C. 154(b) by 203 days.

(21) Appl. No.: 14/071,724

(22) Filed: Nov. 5, 2013

(65) Prior Publication Data

US 2015/0124416 A1    May 7, 2015

(51) Int. Cl.
| | |
|---|---|
| *H01K 3/10* | (2006.01) |
| *H05K 1/18* | (2006.01) |
| *B42D 25/313* | (2014.01) |
| *H05K 3/00* | (2006.01) |
| *H05K 3/40* | (2006.01) |
| *H05K 3/42* | (2006.01) |
| *H05K 3/46* | (2006.01) |

(52) U.S. Cl.
CPC .............. *H05K 1/183* (2013.01); *B42D 25/313* (2014.10); *H05K 3/4697* (2013.01); *H05K 3/0044* (2013.01); *H05K 3/4046* (2013.01); *H05K 3/421* (2013.01); *H05K 3/4623* (2013.01); *H05K 2201/0187* (2013.01); *H05K 2201/0919* (2013.01); *H05K 2201/09845* (2013.01); *H05K 2201/10106* (2013.01); *H05K 2201/10121* (2013.01); *H05K 2201/10287* (2013.01); *H05K 2203/0228* (2013.01); *Y10T 29/4913* (2015.01); *Y10T 29/49018* (2015.01); *Y10T 29/49117* (2015.01)

(58) Field of Classification Search
CPC ................... H01L 2924/12041; H01L 25/167; Y10T 29/49117; Y10T 29/49018; F21V 19/001; H05K 2201/10106
USPC ........... 29/852, 825, 829, 832, 837, 842, 846; 257/88, 701, 723, 730, E21.499, 257/E33.059
See application file for complete search history.

(56) References Cited

U.S. PATENT DOCUMENTS

| | | | |
|---|---|---|---|
| 8,535,961 B1 * | 9/2013 | Kuo | H01L 33/486 257/88 |
| 8,937,382 B2 * | 1/2015 | Teh | H01L 23/3121 257/701 |

* cited by examiner

Primary Examiner — Thiem Phan
(74) Attorney, Agent, or Firm — Che-Yang Chen; Law Office of Michael Chen

(57) ABSTRACT

A printed circuit board having an electronic component embedded and a method making the same are disclosed. The printed circuit board has four electrically conductive layers and three core layers formed interleavedly. By properly removing a portion of the printed circuit board, the electronic component can be exposed. It has advantages that the exposed electronic component can be a CCD, CMOS or module. When the devices mentioned are embedded in the printed circuit board, one part of them can be exposed from the printed circuit board for normal functions. The overall thickness of the printed circuit board assembly can be minimized to meet the trend of compact design of electronic products.

11 Claims, 6 Drawing Sheets

METHOD OF MANUFACTURING PRINTED CIRCUIT BOARD HAVING ELECTRONIC COMPONENT EMBEDDED

FIELD OF THE INVENTION

The present invention relates to a printed circuit board and a method making the same. More particularly, the present invention relates to a printed circuit board which has an electronic component embedded and a method making the same.

BACKGROUND OF THE INVENTION

It is a trend to make electronic products small in size and compact in thickness. There are many issues, such as heat dissipation, which need to be settled during the design process. One of these issues is how to consolidate necessary components into an integrated circuit (IC) or a printed circuit board (PCB). An electronic component can be embedded in a printed circuit board during the printed circuit board manufacturing processes. The technique started from buried resistor technology Ohmega Technologies, Inc. Although it was only passive components can be used in the beginning, it becomes well accepted to the industrial now days that active components can be applied by various modifications and invention.

Among all integrated circuits, there are several kinds which have specified functions and need to work interactively with external environment. Exemplary examples are charge-coupled devices (CCD) and complementary metal-oxide-semiconductors (CMOS). A fingerprint reader sensor and a mouse sensor are typical products for the CCD and CMOS, respectively. The fingerprint reader sensor needs to detect change of capacitance and the mouse sensor needs to receive light change over a surface. Even those integrated circuits are embedded into a PCB, it is required a proper arrangement and configuration for the integrated circuits to expose to the external environment. Meanwhile, a good design for the integrated circuits to work is important, as well.

Reviewing the prior arts, there are several inventions that have focused on some of the requirements mentioned above. First, the U.S. Pat. No. 8,083,954 discloses a method for fabricating a component-embedded printed circuit board. The method includes: providing a carrier plate having a plating metal layer plated thereon, disposing an electronic component on the plating metal layer of the carrier plate, laminating a metal layer onto the plating metal layer having the electronic component disposed thereon and the carrier plate by a dielectric film, removing the carrier plate and exposing the plating metal layer, and patterning at least one of the metal layer and the plating metal layer to be a circuit layer. '954 focuses on how to reduce the overall thickness of a printed circuit board. It can not apply to active components for embedding processes.

Next, the U.S. Pat. No. 8,302,299 discloses a method of manufacturing a multilayer printed circuit board of a built-in electronic device. It provides a substrate having a copper clad laminate and a first dielectric layer. The first dielectric layer is laminated onto the copper clad laminate and has a cavity for accommodating the electronic device. A second dielectric layer is laminated onto the substrate and electronic device to produce a base circuit board with an embedded electronic device. A build-up circuit layer is formed on the base circuit board. The first and second dielectric layers are made of a plastic material. Obviously, the embedded electronic device can not be the CCD or CMOS because there is no window for a portion to expose to the external environment.

Last, the US Patent Application No. 20130092420 depicts an invention which relates to a method of manufacturing an embedded printed circuit board. An embedded multilayer printed circuit board includes first, second and third circuit substrates, and a flexible circuit substrate. The first circuit substrate includes a first base layer and a first electrically conductive layer. The second circuit substrate includes a second base layer and a second circuit layer. The second circuit substrate also defines a receiving hole. The third circuit substrate includes a third circuit layer, a third base layer, a fourth circuit layer, and an electronic element mounted on the third circuit layer. The third circuit layer and the fourth circuit layer are formed on the opposite sides of the third base layer. The electronic element is received in the receiving hole. The flexible circuit substrate includes a flexible base layer and a flexible circuit layer. The first circuit layer is electrically connected to the fourth circuit layer by the flexible circuit layer. The invention indicates a simple and low-cost method to manufacture embedded printed circuit boards. However, it is still fail to expose the embedded electronic element. As well, no solution for protective an expose embedded active component is mentioned.

Therefore, a method for manufacturing printed circuit board which has an electronic component embedded, allowing the electronic component exposed to external environment, providing necessary designs for the electronic component to work and minimizing the overall thickness of the printed circuit board assembly is still desired.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In accordance with an aspect of the present invention, a method of manufacturing a printed circuit board having an electronic component embedded, comprises: providing a multilayer printed circuit board, having at least a first electrically conductive layer, a first core layer, a second electrically conductive layer, a second core layer, a third electrically conductive layer, a third core layer and a fourth electrically conductive layer, wherein an embedded portion of the second core layer is hollow and the electronic component is located therein, a bound pad is formed on a portion of a top surface of the electronic component and fixed on the third core layer, and each of the electrically conductive layers forms a desired circuit; forming a number of via holes from the bound pad to the first electrically conductive layer; electrically connecting two sides of each via hole; and removing a portion of the first core layer to expose at least a portion of the electronic component and a portion of the second core layer. At least one side of an exposed top surface of the electronic component is higher than or equal to a side of a top surface of the exposed second core layer neighboring to each other.

Preferably, the electronic component is an integrated circuit (IC), a module or a light emitting diode (LED).

Preferably, the integrated circuit is a charge-coupled device (CCD) or a complementary metal-oxide-semiconductor (CMOS).

Preferably, the module is a fingerprint reader module.

Preferably, the bound pad is a layer of copper, aluminum, gold or alloy thereof, having thickness of 4 μm or thicker.

Preferably, the bound pad is at least 200 μm×200 μm.

Preferably, the via hole is a laser via hold or a plated through hole.

Preferably, a wire bonding is applied in the laser via hole to electrically connect two sides thereof.

Preferably, the step of removing is realized by a die-cutting process.

Preferably, an adhesive is applied between adjacent electrically conductive layer and core layer for lamination.

Preferable, the bound pad is used to electrically link the electronic component to the first electrically conductive layer and provide protection to the electronic component when the via holes are forming.

In accordance with an aspect of the present invention, a printed circuit board having an electronic component embedded, comprises: a first electrically conductive layer; a first core layer having a portion removed to expose at least a portion of the electronic component and a portion of a second core layer; the second electrically conductive layer; a second core layer having an area which is hollow so as to locate the electronic component therein; a third electrically conductive layer; a third core layer; and a fourth electrically conductive layer. A bound pad is formed on a portion of a top surface of the electronic component. A number of via holes from the bound pad to the first electrically conductive layer are formed and electrically connected therebetween. Each of the electrically conductive layers forms a desired circuit. At least one side of an exposed top surface of the electronic component is higher than or equal to a side of a top surface of the exposed second core layer neighboring to each other.

Preferably, the electronic component is an integrated circuit (IC), a module or a light emitting diode (LED).

Preferably, the integrated circuit is a charge-coupled device (CCD) or a complementary metal-oxide-semiconductor (CMOS).

Preferably, the module is a fingerprint reader module.

Preferably, the bound pad is a layer of copper, aluminum, gold or alloy thereof, having thickness of 4 µm or thicker.

Preferably, the bound pad is at least 200 µm×200 µm.

Preferably, the via hole is a laser via hold or a plated through hole.

Preferably, a wire bonding is applied in the laser via hole to electrically connect two sides thereof.

Preferably, an adhesive is applied between adjacent electrically conductive layer and core layer for lamination.

Preferable, the bound pad is used to electrically link the electronic component to the first electrically conductive layer and provide protection to the electronic component when the via holes are forming.

DETAILED DESCRIPTION OF THE PREFERRED EMBODIMENTS

The present invention will now be described more specifically with reference to the following embodiments.

First Embodiment

Figure 1:
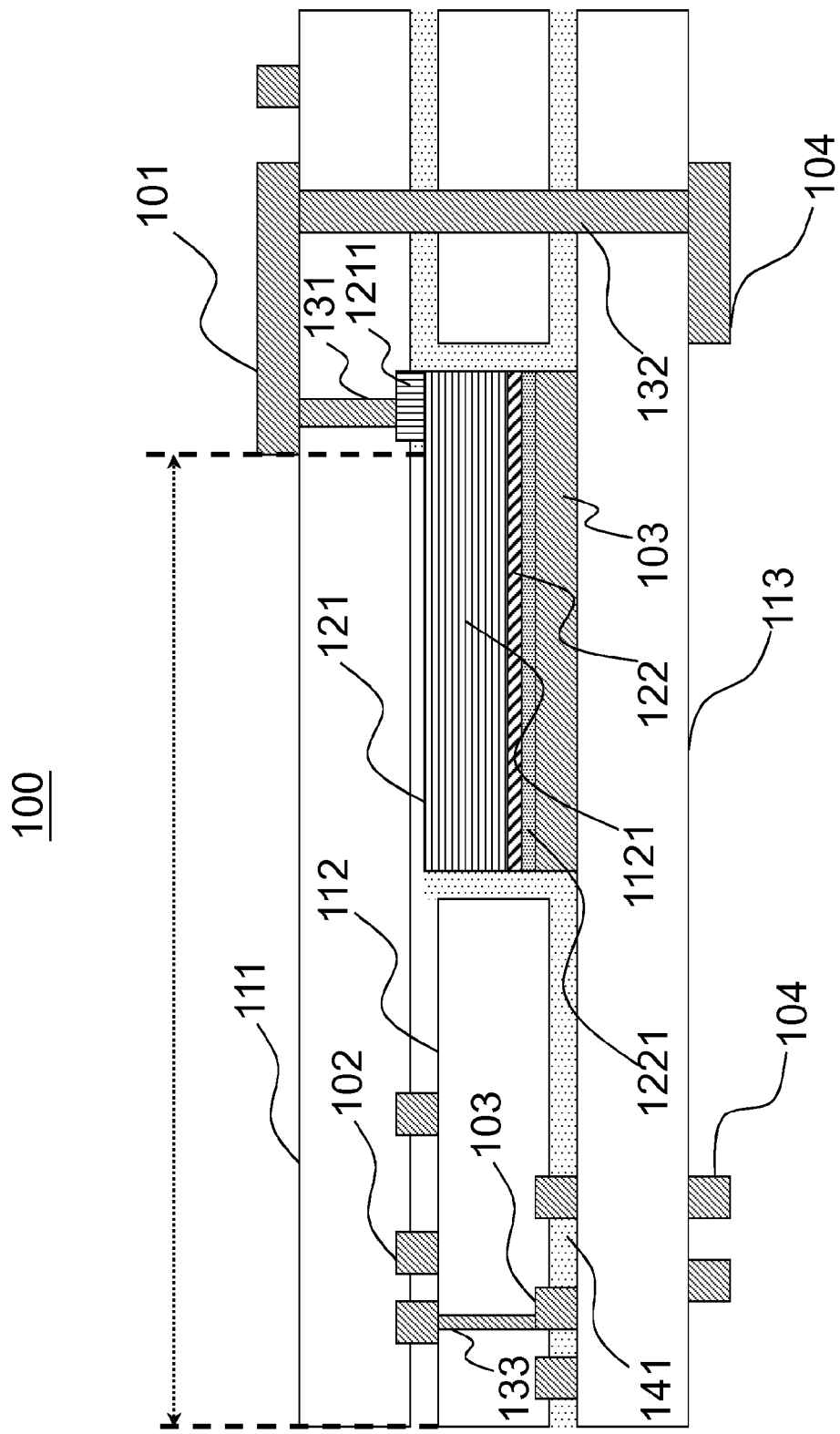
FIG. 1 illustrates a cross-sectional view of a multilayer printed circuit board in a first embodiment according to the present invention.
Figure 2:
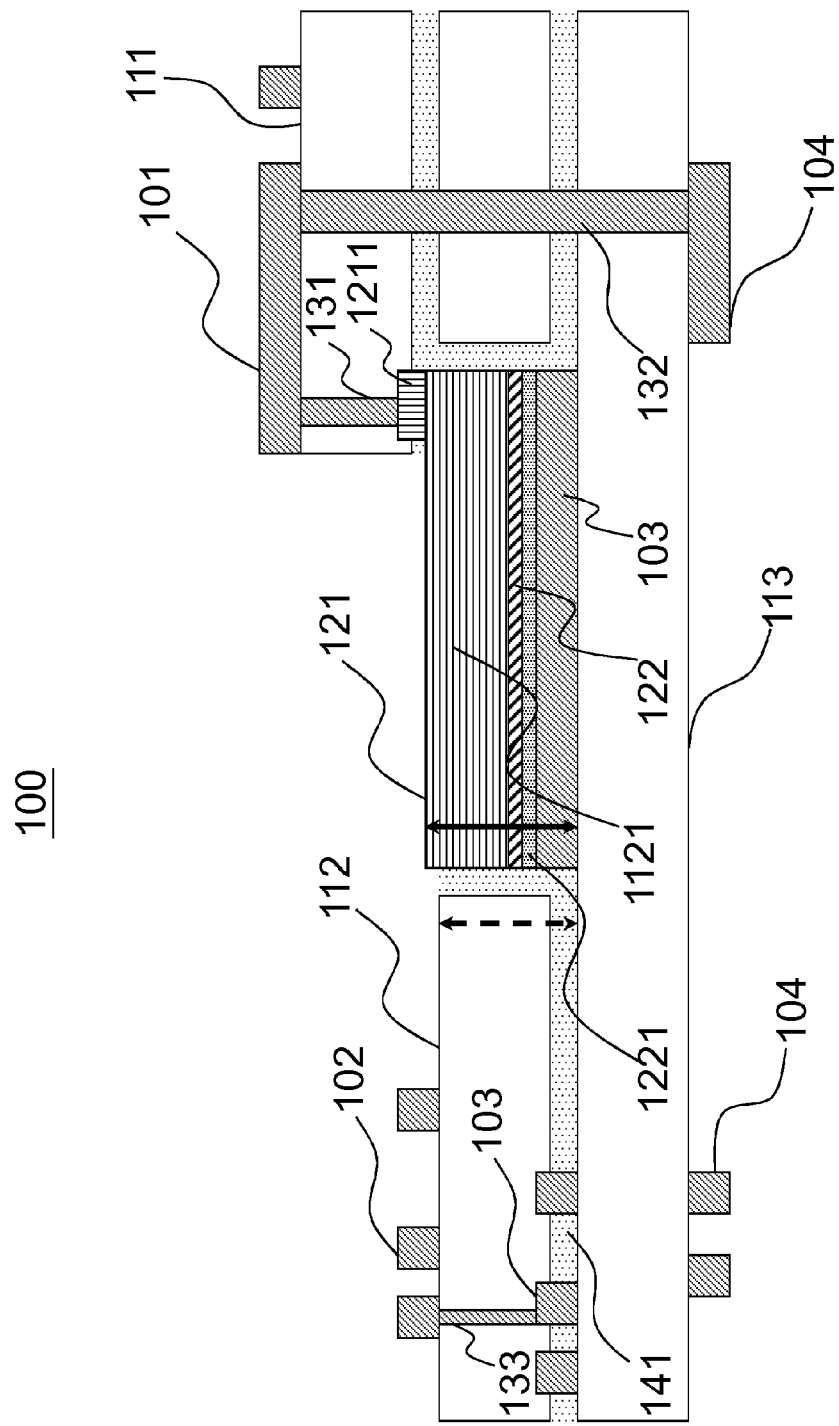
FIG. 2 illustrates another cross-sectional view of the multilayer printed circuit board after a removing process in the first embodiment.
Figure 3:
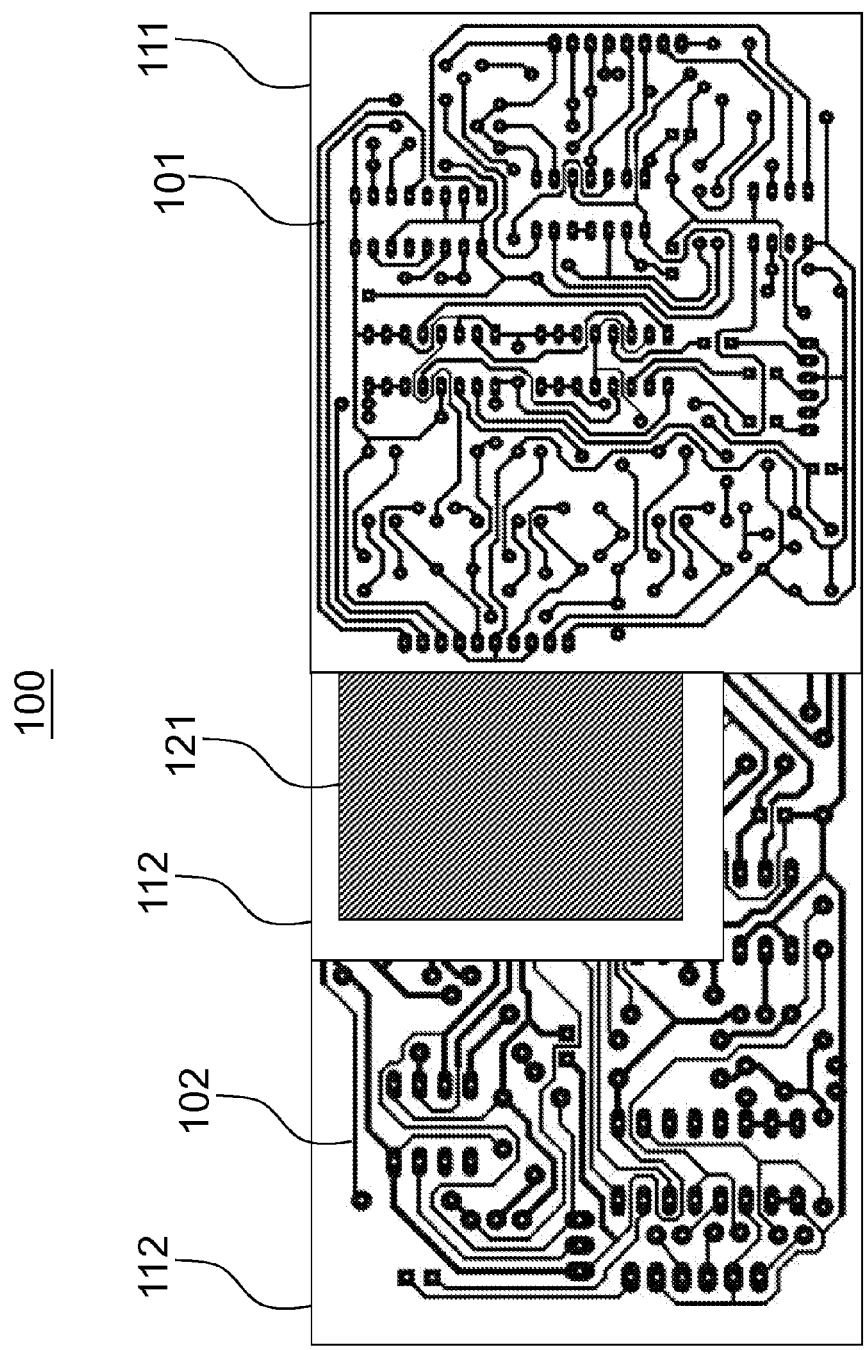
FIG. 3 is an illustrative top view of the multilayer printed circuit board in the first embodiment.
Figure 4:
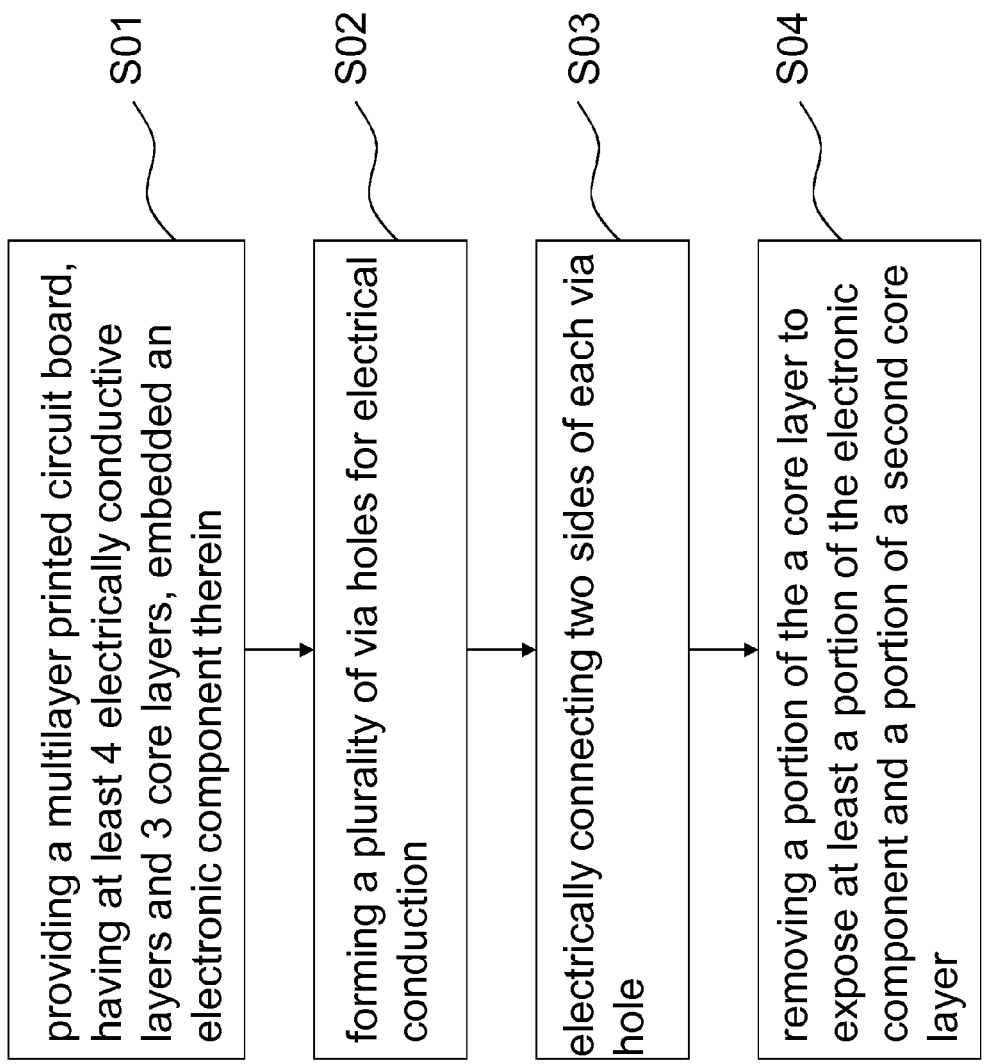
FIG. 4 is a flowchart of a method of manufacturing a printed circuit board which has an electronic component embedded according to the present invention.

Please refer to FIG. 1 to FIG. 4. A first embodiment of the present invention is disclosed. FIG. 1 illustrates a cross-sectional view of a multilayer printed circuit board in the first embodiment according to the present invention. FIG. 2 illustrates another cross-sectional view of the multilayer printed circuit board after a removing process in the first embodiment. FIG. 3 is an illustrative top view of the multilayer printed circuit board in the first embodiment. FIG. 4 is a flowchart of a method of manufacturing a printed circuit board which has an electronic component embedded according to the present invention.

According to the present invention, a method of manufacturing a printed circuit board which has an electronic component embedded starts from providing a multilayer printed circuit board 100 (S01). The multilayer printed circuit board 100 is a 4-layer printed circuit board and has at least four electrically conductive layers and three core layers. In the present embodiment, there are a first electrically conductive layer 101, a first core layer 111, a second electrically conductive layer 102, a second core layer 112, a third electrically conductive layer 103, a third core layer 113 and a fourth electrically conductive layer 104. In order to have a better description of the embodiment and make it easy to understand the drawings, the first electrically conductive layer 101 uses two blocks to represent the cross section of a real circuit layout of copper. So are the second electrically conductive layer 102, the third electrically conductive layer 103 and the fourth electrically conductive layer 104. Each of the electrically conductive layers forms a desired circuit. It should be noticed that sketches of FIG. 1 and FIG. 2 are not to scale. Dimensions in vertical direction are exaggerated just for a clear view.

An embedded portion 1121 of the second core layer 112 is hollow and an electronic component is located there. In this embodiment, the electronic component is a fingerprint reader module 121. The fingerprint reader module 121 has a bound pad 1211 at a top surface of the fingerprint sensor 121. Preferably, it is along one edge of that surface. The only bound pad 1211 is shown because the cross section only has one bound pad. The number of the bound pad 1211 is not limited to one. There can be many bound pads based on the requirement of design. The fingerprint reader module 121 has a p-type substrate 122 at its bottom. It is fixed and electrically linked to the third electrically conductive layer 103 by a conductive adhesive 1221.

According to the present invention, the electronic component can be other device. For example, an integrated circuit (IC), another module or a light emitting diode (LED) is commonly used. Most applied components are a charge-coupled device (CCD) and a complementary metal-oxide-semiconductor (CMOS). This is because a portion of those components needs to be exposed to the external environment to perform normal functions. For instance, the fingerprint reader module 121 is a kind of charge-coupled device. It needs to identify a specified fingerprint by detect change of capacitances when a finger is in contact with its sensor surface (not shown). Therefore, the sensor must face out from the multilayer printed circuit board 100 rather than be blocked by some part of the multilayer printed circuit board 100.

The bound pad 1211 is coated with a layer of copper. In practice, the coated material is not limited to copper. It can be aluminum, gold or alloy of the metals. It has thickness of 4 μm or thicker. Sizewise, the bound pad 1211 is around 200 μm×200 μm. According to the present invention, 200 μm×200 μm is the smallest area which can be embedded in the multilayer printed circuit board 100.

Next, according to the present invention, form a number of via holes for electrical conduction (S02). That is, the via holes are formed from the bound pad 1211 to the first electrically conductive layer 101. A first plated through hole 131 is used in FIG. 1 and FIG. 2 for illustration. When the multilayer printed circuit board 100 was formed and the fingerprint reader module 121 is embedded, many other via holes were already ready. For example, a second plated through hole 132 and a buried via hole 133 were formed. However, these via holes are made only for electrical conduction between two electrically conductive layers. The first plated through hole 131 made by S02 is only for electrical conduction between one electrically conductive layer (or circuit) with the fingerprint reader module 121, for providing power to the fingerprint reader module 121 and data transmission. Of course, the first plated through hole 131 is not limited to link to the first electrically conductive layer 101 on the top side. The bound pad 1211 is used to electrically link the fingerprint sensor 121 to the first electrically conductive layer 101 and provide protection to the fingerprint sensor 121 when the first plated through hole 131 was forming.

Then, electrically connect two sides of each via hole (S03). This is for the fingerprint reader module 121 to get power, link to other circuit in other electrically conductive layer and transmit data.

Finally, remove a portion of the first core layer 111 to expose at least a portion of the fingerprint reader module 121 and a portion of the second core layer 112 (S04). Comparing FIG. 1 and FIG. 2, a portion of the first core layer 111 between dash lines are removed. In this embodiment, there is no first electrically conductive layer 101 extending to the top surface of the removed portion of the first core layer 111 because no designer will waste material. Therefore, the present invention doesn't emphasize on this. It should be emphasized that it is not necessary to expose all the top surface of the fingerprint reader module 121. It is workable to reveal only the "reader portion" and conceal other portion under the protection of the first core layer 111 as show in FIG. 1 and FIG. 2. The size of exposed area to the external environment also varies with the printed circuit board design. Please refer to FIG. 3. It is a top view of the multilayer printed circuit board 100. It is easily to identify that only a portion of the fingerprint reader module 121 and a portion of the second core layer 112 are exposed. It is noticed that the circuit on FIG. 3 is also illustrative. It is not necessarily identical to the design shown on the cross-sectional view in FIG. 1 and FIG. 2.

A key point of the present invention is that at least one side of an exposed top surface of the fingerprint reader module 121 is higher than or equal to a side of a top surface of the exposed second core layer 112 neighboring to each other. Please see FIG. 2 again. The solid double-arrowed line is the height of the revealed top surface of the fingerprint reader module 121 to the third core layer 113. The dash double-arrowed line is the height of the revealed top surface of the second core layer 112 to the third core layer 113, including an adhesive layer 141. The difference in between shows one side of the exposed top surface of the fingerprint reader module 121 is higher than the neighboring side of the top surface of the exposed second core layer 112.

For the fingerprint reader module 121, it has an advantage that the when a user's finger is in contact with the top of the "reader portion", the exposed second core layer 112 won't cause a blind corner to partially block the finger to be detected.

Meanwhile, the step of removing is realized by a die-cutting process. It means that there is not adhesive below the removed portion of the first core layer 111. The removed portion of the first core layer 111 can easily removed with glue after die-cutting. According to the spirit of the present invention, the adhesive layer 141 is applied between adjacent electrically conductive layer and core layer for lamination, but not necessary for all of them, as long as a laminating process is required.

According to the arrangement mentioned above, the thickness of the printed circuit board assembly with fingerprint reader module 121 embedded can be thinner than the one with fingerprint reader module 121 mounted on. Thus, it meets the trend to make electronic products small in size and compact in thickness.

Second Embodiment

Figure 5:
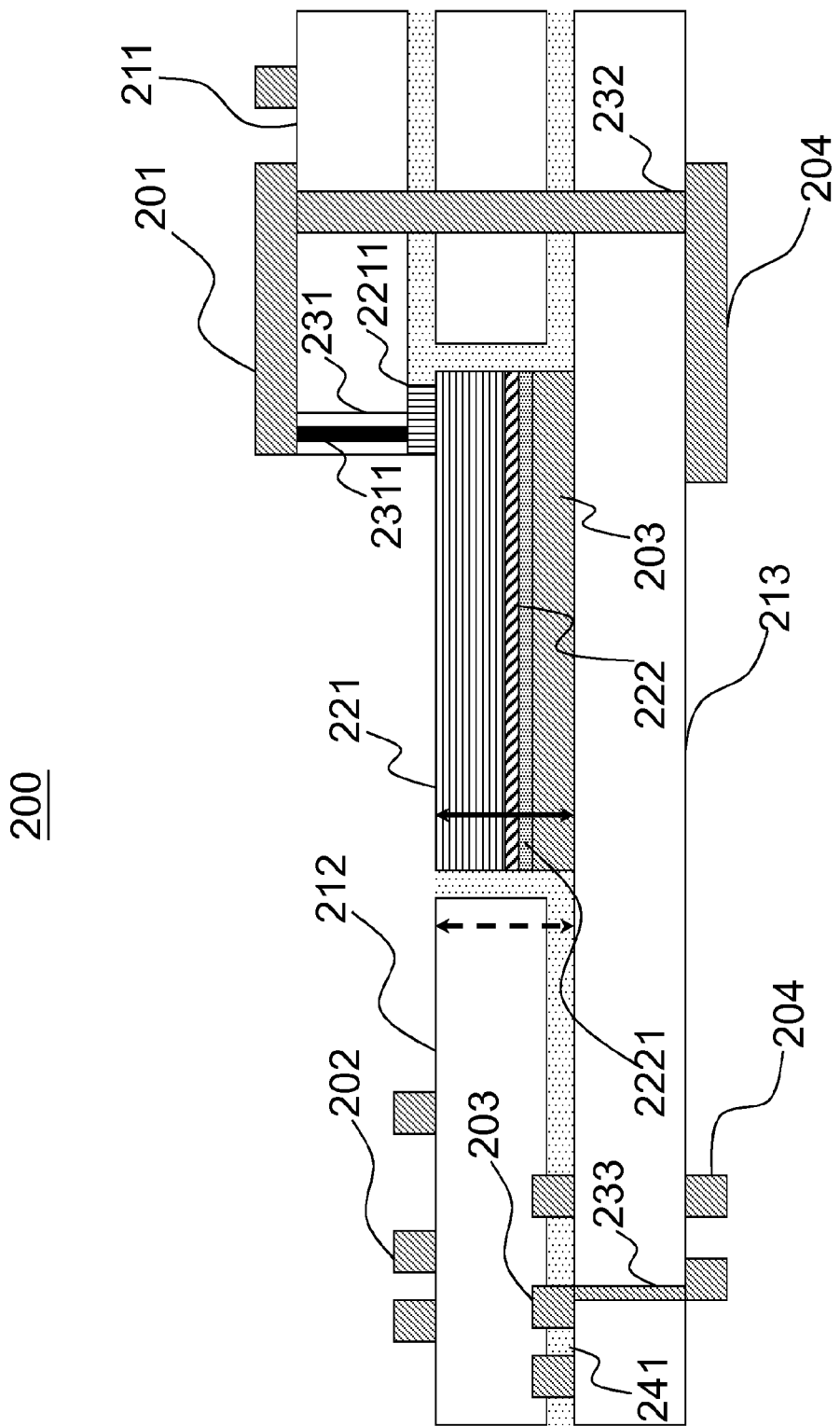
FIG. 5 illustrates a cross-sectional view of a multilayer printed circuit board in a second embodiment according to the present invention.

Please refer to FIG. 5. FIG. 5 illustrates a cross-sectional view of a multilayer printed circuit board in the second embodiment according to the present invention.

A multilayer printed circuit board 200 is a 4-layer printed circuit board and has a first electrically conductive layer 201, a first core layer 211, a second electrically conductive layer 202, a second core layer 212, a third electrically conductive layer 203, a third core layer 213, a fourth electrically conductive layer 204, a second plated through hole 232, a buried via hole 233, an conductive adhesive 2221, and an adhesive layer 241. Functions and relative locations of the items mentioned above correspond to the first electrically conductive layer 101, the first core layer 111, the second electrically conductive layer 102, the second core layer 112, the third electrically conductive layer 103, the third core layer 113, the fourth electrically conductive layer 104, the second plated through hole 132, the buried via hole 133, the conductive adhesive 1221, and the adhesive layer 141 in the first embodiment, respectively. It is not necessary to illustrate them to same time.

The difference between the first embodiment and the second embodiment is that a light emitting diode 221 with a p-type substrate 222 below is used as the embedded electronic component to be exposed. The light emitting diode 221 has a bound pad 2211 at a top surface of the light emitting diode 221. The number of the bound pad 2211 is also not limited to one. There can be many bound pads based on the requirement of design. The light emitting diode 221 has a p-type substrate 222 at its bottom. It is fixed and electrically linked to the third electrically conductive layer 203 by a conductive adhesive 2221.

As many people may know that the light emitting diode 221 emits light in a specified direction, for example, in this embodiment, it is upward. Please refer to FIG. 5. The solid double-arrowed line is the height of the revealed top surface of the light emitting diode 221 to the third core layer 213. The dash double-arrowed line is the height of the revealed top surface of the second core layer 212 to the third core layer 213, including the adhesive layer 241. There is no difference between those two lines. It meant one side of the exposed top surface of the light emitting diode 221 is flush with the neighboring side of the top surface of the exposed second core layer 212. Light beams of the light emitting diode 221 can transmit out without being stopped and the light emitting diode 221 can get protection by the second core layer 212 around.

The other difference is that a via hole 231 is a laser via hold. Not like the first plated through hole 131 in the first embodiment, the via hole 231 has no conductive material coated inside. Therefore, a wire bonding 2311 is applied in the laser via hole 231 to electrically connect two sides.

Third Embodiment

Figure 6:
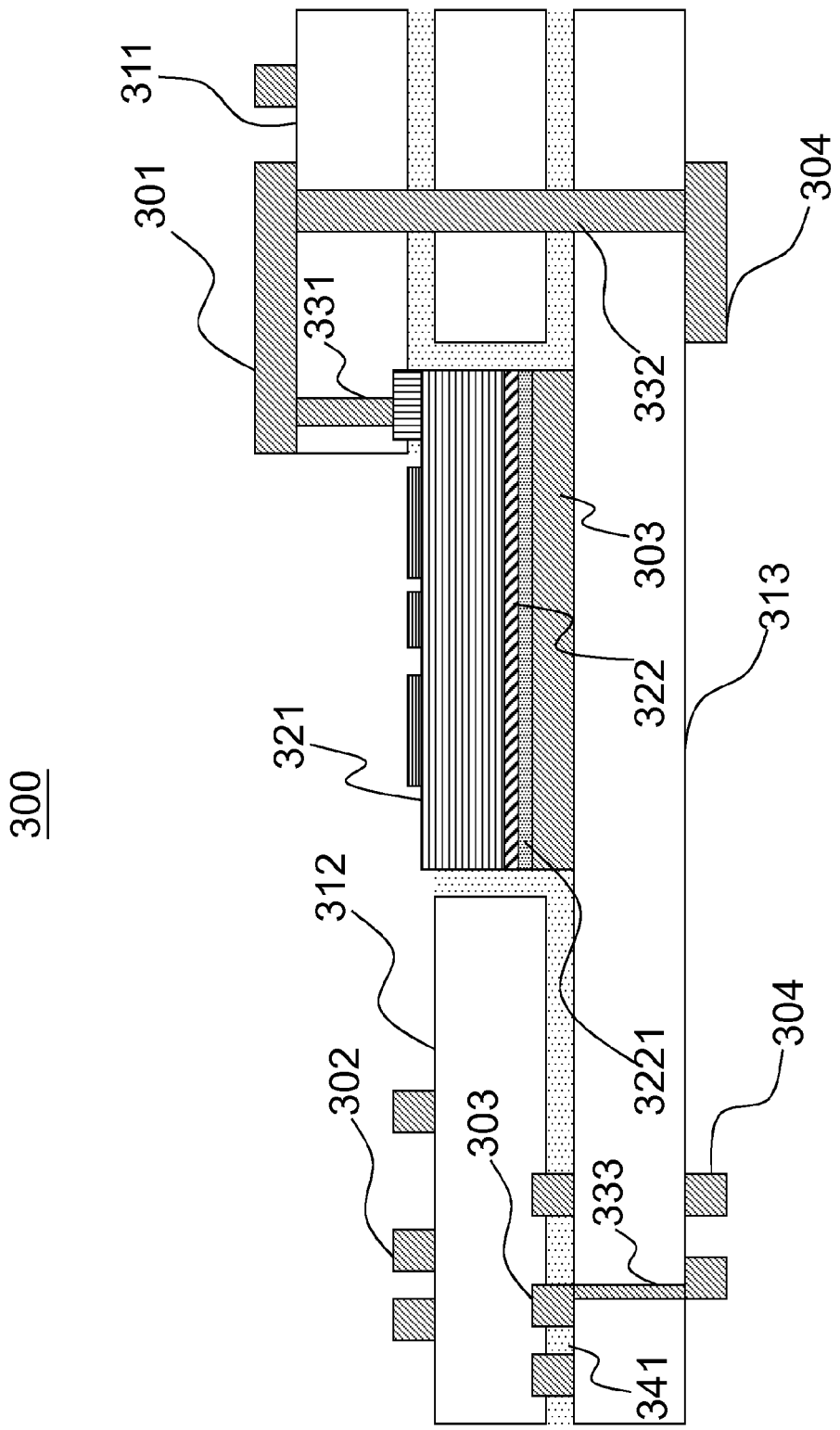
FIG. 6 illustrates a cross-sectional view of a multilayer printed circuit board in a third embodiment according to the present invention.

Please refer to FIG. 6. FIG. 6 illustrates a cross-sectional view of a multilayer printed circuit board in a third embodiment according to the present invention.

A multilayer printed circuit board 300 is a 4-layer printed circuit board and has a first electrically conductive layer 301, a first core layer 311, a second electrically conductive layer 302, a second core layer 312, a third electrically conductive layer 303, a third core layer 313, a fourth electrically conductive layer 304, a conductive adhesive 3221, a first plated through hole 331, a second plated through hole 332, a buried via hole 333 and an adhesive layer 341. Functions and relative locations of the items mentioned above correspond to the first electrically conductive layer 101, the first core layer 111, the second electrically conductive layer 102, the second core layer 112, the third electrically conductive layer 103, the third core layer 113, the fourth electrically conductive layer 104, the conductive adhesive 1221, the first plated through hole 131, the second plated through hole 132, the buried via hole 133 and the adhesive layer 141 in the first embodiment, respectively. It is not necessary to illustrate them to same time.

The difference between the first embodiment and the third embodiment is that a module 321 with a p-type substrate 322 below which has uneven top surface is used as the embedded electronic component to be exposed. According to the spirit of the present invention, any kind of module can be applied as long as there is a requirement to make the printed circuit board as slim as possible.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method of manufacturing a printed circuit board having an electronic component embedded, comprising:

providing a multilayer printed circuit board, having at least a first electrically conductive layer, a first core layer, a second electrically conductive layer, a second core layer, a third electrically conductive layer, a third core layer and a fourth electrically conductive layer, wherein an embedded portion of the second core layer is hollow and the electronic component is located therein, a bound pad is formed on a portion of a top surface of the electronic component, and each of the electrically conductive layers forms a desired circuit;

forming a plurality of via holes from the bound pad to the first electrically conductive layer;

electrically connecting two sides of each via hole; and removing a portion of the first core layer to expose at least a portion of the electronic component and a portion of the second core layer, wherein at least one side of an exposed top surface of the electronic component is higher than or equal to a side of a top surface of the exposed second core layer neighboring to each other.

2. The method according to claim 1, wherein the electronic component is an integrated circuit (IC), a module or a light emitting diode (LED).

3. The method according to claim 2, wherein the integrated circuit is a charge-coupled device (CCD) or a complementary metal-oxide-semiconductor (CMOS).

4. The method according to claim 2, wherein the module is a fingerprint reader module.

5. The method according to claim 1, wherein the bound pad is a layer of copper, aluminum, gold or alloy thereof, having thickness of 4 μm or thicker.

6. The method according to claim 1, wherein the bound pad is at least 200 μm×200 μm.

7. The method according to claim 1, wherein the via hole is a laser via hold or a plated through hole.

8. The method according to claim 7, wherein a wire bonding is applied in the laser via hole to electrically connect two sides thereof.

9. The method according to claim 1, wherein the step of removing is realized by a die-cutting process.

10. The method according to claim 1, wherein an adhesive is applied between adjacent electrically conductive layer and core layer for lamination.

11. The method according to claim 1, wherein the bound pad is used to electrically link the electronic component to the first electrically conductive layer and provide protection to the electronic component when the via holes are forming.

* * * * *